United States Patent
Ogino

(10) Patent No.: US 12,258,164 B2
(45) Date of Patent: Mar. 25, 2025

(54) METHOD FOR PREPARING PACKAGE OF SPUTTERING TARGET, AND METHOD FOR TRANSPORTING SAME

(71) Applicant: JX Nippon Mining & Metals Corporation, Tokyo (JP)

(72) Inventor: Shin-ichi Ogino, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 624 days.

(21) Appl. No.: 16/981,396

(22) PCT Filed: Sep. 20, 2019

(86) PCT No.: PCT/JP2019/037139
§ 371 (c)(1),
(2) Date: Sep. 16, 2020

(87) PCT Pub. No.: WO2020/202603
PCT Pub. Date: Oct. 8, 2020

(65) Prior Publication Data
US 2021/0253286 A1    Aug. 19, 2021

(30) Foreign Application Priority Data
Mar. 29, 2019    (JP) .................. 2019-069394

(51) Int. Cl.
*B65B 5/04*    (2006.01)
*B65B 31/04*    (2006.01)
(Continued)

(52) U.S. Cl.
CPC .............. *B65B 5/045* (2013.01); *B65B 31/04* (2013.01); *B65B 31/048* (2013.01);
(Continued)

(58) Field of Classification Search
CPC ..... B65B 2220/20; B65B 31/04; B65B 5/045; B65D 77/04
See application file for complete search history.

(56) References Cited

U.S. PATENT DOCUMENTS

| | | | | |
|---|---|---|---|---|
| 4,267,684 A | * | 5/1981 | Ambrose ................ | B65B 23/00 53/472 |
| 4,434,893 A | * | 3/1984 | Barlow .................. | B65D 75/38 206/532 |

(Continued)

FOREIGN PATENT DOCUMENTS

| | | |
|---|---|---|
| CN | 101549781 A | 10/2009 |
| CN | 101709452 A | 5/2010 |

(Continued)

OTHER PUBLICATIONS

Vaisala Oyj, Dew Point in Compressed Air, Vaisala, 2011 [retrieved on May 6, 2022], Retrieved from the Internet: <URL: https://www.plantservices.com/assets/wp_downloads/pdf/111212-Vaisala-compressed-air-FAQ.pdf>. (Year: 2011).*

(Continued)

*Primary Examiner* — Joshua G Kotis
(74) *Attorney, Agent, or Firm* — Nields, Lemack & Frame, LLC

(57) ABSTRACT

A method for preparing a package that can effectively suppress surface alteration even in a sputtering target whose surface is likely to be altered by moisture such as a sputtering target comprising an oxide of boron is provided. A method for preparing a package of sputtering target, including a step 1 of housing a sputtering target in a first packaging bag made of a film having a water vapor permeability of 1 g/(m²·24 h) or less, and then vacuum sealing an opening of the first packaging bag; and a step 2 of housing the first packaging bag which has been vacuum sealed in the step 1, in a second packaging bag made of a film having a water (Continued)

vapor permeability of 1 g/(m²·24 h) or less, and then enclosing one or more cushion gases selected from a group consisting of air and inert gas in the second packaging bag, and sealing an opening of the second packaging bag.

18 Claims, 1 Drawing Sheet

(51) Int. Cl.
    *B65B 51/14*         (2006.01)
    *B65B 55/19*         (2006.01)
    *B65D 81/26*         (2006.01)
    *C23C 14/34*         (2006.01)
    *B65D 77/04*         (2006.01)

(52) U.S. Cl.
    CPC ............ *B65B 51/146* (2013.01); *B65B 55/19* (2013.01); *B65D 81/268* (2013.01); *C23C 14/3414* (2013.01); *B65B 2220/20* (2013.01); *B65D 77/04* (2013.01); *C23C 14/3407* (2013.01)

(56) References Cited

U.S. PATENT DOCUMENTS

| | | | | |
|---|---|---|---|---|
| 4,723,974 A * | 2/1988 | Ammerman | ......... | A01N 1/0273 |
| | | | | 62/530 |
| 4,949,530 A * | 8/1990 | Pharo | ..................... | B65D 81/03 |
| | | | | 53/472 |
| 5,294,312 A * | 3/1994 | Chin | ...................... | C23C 14/14 |
| | | | | 427/404 |
| 5,518,542 A | 5/1996 | Matsukawa et al. | | |
| 5,698,250 A * | 12/1997 | DelDuca | .............. | B65D 77/003 |
| | | | | 426/396 |
| 6,030,514 A | 2/2000 | Dunlop et al. | | |
| 6,321,509 B1 * | 11/2001 | DelDuca | ................. | B65B 9/073 |
| | | | | 53/511 |
| 6,336,340 B1 * | 1/2002 | Laby | ...................... | B65D 75/38 |
| | | | | 62/457.2 |
| 6,520,333 B1 * | 2/2003 | Tschantz | .............. | B65D 81/052 |
| | | | | 383/3 |
| 9,511,922 B1 * | 12/2016 | Breedwell | ............... | B65B 85/34 |
| 10,233,005 B1 * | 3/2019 | De Bonet | ............ | B65D 81/052 |
| 10,336,483 B1 * | 7/2019 | Kumar | ................... | B65B 23/00 |
| 10,370,168 B1 * | 8/2019 | Kimchi | ................. | B65B 31/047 |
| 2003/0054074 A1 * | 3/2003 | DelDuca | .................. | A23B 4/16 |
| | | | | 426/129 |
| 2003/0188964 A1 * | 10/2003 | Hasegawa | ................. | C23C 4/01 |
| | | | | 204/192.15 |
| 2004/0231981 A1 * | 11/2004 | Takahashi | ............. | C23C 14/086 |
| | | | | 204/298.13 |
| 2006/0062949 A1 * | 3/2006 | Hanaichi | ................... | B65B 9/06 |
| | | | | 428/35.2 |
| 2007/0131545 A1 | 6/2007 | Okabe et al. | | |
| 2009/0249747 A1 | 10/2009 | Nishiura et al. | | |
| 2010/0018541 A1 * | 1/2010 | Gerardi | ................. | A24B 15/282 |
| | | | | 131/352 |
| 2011/0162322 A1 | 7/2011 | Satoh et al. | | |
| 2012/0045380 A1 | 2/2012 | Satoh et al. | | |
| 2012/0269459 A1 * | 10/2012 | Howes | ................. | B65D 81/075 |
| | | | | 53/79 |
| 2013/0277214 A1 * | 10/2013 | Narita | ................. | C23C 14/3407 |
| | | | | 204/298.13 |
| 2014/0251801 A1 * | 9/2014 | Zhang | ................... | C22C 1/0425 |
| | | | | 419/33 |
| 2018/0021475 A1 * | 1/2018 | Nomura | ................... | G02C 7/04 |
| | | | | 53/428 |
| 2019/0092499 A1 * | 3/2019 | Fournier | ............... | B32B 15/088 |
| 2019/0237349 A1 * | 8/2019 | Ikenaga | ................. | B65D 81/05 |
| 2020/0024057 A1 * | 1/2020 | Borrero | ................... | B65B 55/20 |
| 2020/0039670 A1 * | 2/2020 | Thürig | .................... | B65B 57/02 |

FOREIGN PATENT DOCUMENTS

| | | |
|---|---|---|
| CN | 201801024 U | 4/2011 |
| CN | 102203314 A | 9/2011 |
| JP | 2000-1775 A | 1/2000 |
| JP | 2002-511115 A | 4/2002 |
| JP | 2005-29233 A | 2/2005 |
| JP | 2005-67617 A | 3/2005 |
| JP | 2017-88956 A | 5/2017 |
| JP | 2017-179464 A | 10/2017 |
| JP | 2018-47922 A | 3/2018 |
| TW | 298343 U | 2/1997 |
| TW | 200944433 A | 11/2009 |
| WO | 2005/037649 A1 | 4/2005 |
| WO | 2010/050409 A1 | 5/2010 |
| WO | 2011/062003 A1 | 5/2011 |
| WO | 2014/178310 A1 | 11/2014 |

OTHER PUBLICATIONS

International Preliminary Report on Patentability issued Sep. 30, 2021 in corresponding PCT application No. PCT/JP2019/037139.
International Search Report mailed Nov. 19, 2019 in corresponding PCT application No. PCT/JP2019/037139.

* cited by examiner

METHOD FOR PREPARING PACKAGE OF SPUTTERING TARGET, AND METHOD FOR TRANSPORTING SAME

FIELD OF THE INVENTION

The present disclosure relates to a method for preparing a package of sputtering target, and a method for transporting the same. In particular, the present disclosure relates to a method for preparing a package of sputtering target comprising an oxide of boron.

BACKGROUND OF THE INVENTION

Sputtering targets are widely used as materials for forming thin films with a sputtering method in various industrial fields such as semiconductor devices, displays, optical recording disks, magnetic disks, sensors, and functional glass. One of the important performances required for a sputtering target is that there is little abnormal discharge (arcing) that occurs during sputtering. When arcing occurs, the target material around the arcing is discharged from the target in clusters (in a massive form) and is deposited on the film forming substrate, reducing the yield of the sputtered film.

As a cause of arcing, it is known that alteration or the like of the target surface may be caused by dust deposited on the target surface or moisture deposited on the target surface. Therefore, for the purpose of protection from dust and moisture, it is known to put a sputtering target in a container or a film-shaped seal and to perform vacuum sealing or introduce a desiccant.

Patent Literature 1 (WO2010/050409) discloses a method for storing a sputtering target made of a rare earth metal or an oxide thereof, characterized in that, into a container or a film-shaped seal for storing the target, an oxide of the same rare earth metal as the target made of the rare earth metal or the oxide thereof to be stored is introduced as a desiccant, and the container or the film-shaped seal for storing is vacuum sealed and stored.

Patent Literature 2 (Japanese Patent Application Publication No. 2018-047922A) discloses a method for packaging, comprising filling a hollow portion of a cylindrical sintered body with gas, and forming a protective member such that it covers the circumferential surface, the lateral surface, and the openings of both ends of the body and seals the hollow portion. As the protective member, it is described in this literature that a film-shaped resin can be used, and a laminated film obtained by laminating a plurality of films having different properties can be used. In this literature, it is disclosed that a laminated film in which a functional film is sandwiched between two polyethylene films is used, and a preferred functional film is an EVAL (registered trademark) film available from Kuraray. The physical properties of EVAL film are as follows.
[Eval Film]
  Oxygen permeability (20° C., 90% RH): 30 cc/(d·atm)
  Water vapor permeability (40° C., 90% RH): 5.3 g/(m$^2$·day)
  Puncture strength: 11.1 kgf (10.9×10$^{-3}$ MPa)
  Tensile strength: 40 MPa

CITATION LIST

Patent Literature

[Patent Literature 1] WO2010/050409
[Patent Literature 2] Japanese Patent Application Publication No. 2018-047922A

SUMMARY OF THE INVENTION

As described above, there is known a method for packaging a sputtering target in which the sputtering target is placed in a container or a film-shaped seal and it is vacuum sealed or a desiccant is introduced. However, generally commercially available packaging materials cannot completely block moisture no matter how low water permeability they have.

Among sputtering targets, there are ones whose surface is likely to be altered due to moisture. For example, in the case of a sputtering target comprising an oxide of boron as typified by $B_2O_3$, even if the sputtering target is packaged by vacuum packing or introducing a desiccant, there has been a problem that moisture permeates into the packing material due to long-time transportation such as air transportation, so that $B_2O_3$ is dissolved, and boric acid deposition occurs. If the deposited boric acid is left as it is, a redeposition film will be deposited on boric acid during sputtering. Since the boric acid has poor adhesion to the target, the deposited redeposition film peels off and scatters on the erosion surface as sputtering is continued. Accordingly, it causes abnormal discharge, causing a decrease in yield.

The present invention is created in view of the above circumstances, and in one embodiment, a object of the present invention is to provide a method for preparing a package that can effectively suppress surface alteration even in a sputtering target whose surface is likely to be altered by moisture such as a sputtering target comprising an oxide of boron. Further, in another embodiment, an object of the present invention is to provide a method for transporting such a package.

The present inventor has conducted extensive studies in order to solve the above-mentioned problems. As a result, it has been found effective to solve the problems by double-packaging the sputtering target using a film with a water vapor permeability of 1 g/(m$^2$·24 h) or less, vacuum-packaging the inner film, and enclosing a gas at a predetermined pressure between the inner film and the outer film as well. The present invention has been completed based on the above findings and is exemplified below.

[1]
A method for preparing a package of sputtering target, comprising
  a step 1 of housing a sputtering target in a first packaging bag made of a film having a water vapor permeability of 1 g/(m$^2$·24 h) or less, and then vacuum sealing an opening of the first packaging bag; and
  a step 2 of housing the first packaging bag, which has been vacuum sealed in the step 1, in a second packaging bag made of a film having a water vapor permeability of 1 g/(m$^2$·24 h) or less, and then enclosing one or more cushion gases selected from a group consisting of air and inert gas in the second packaging bag, and sealing an opening of the second packaging bag.

[2]
The method for preparing a package of sputtering target according to [1], wherein a gas pressure at 20° C. in the vacuum sealed first packaging bag is 250 Pa (abs) or less.

[3]
The method for preparing a package of sputtering target according to [1] or [2], wherein a gas pressure at 20° C. in the second packaging bag after the cushion gas is enclosed is 10 kPa (abs) or more.

[4]
The method for preparing a package of sputtering target according to [1] or [2], wherein a gas pressure at 20° C. in the second packaging bag after the cushion gas is enclosed is 10 kPa (abs) or more and 120 kPa (abs) or less.

[5]
The method for preparing a package of sputtering target according to any one of [1] to [4], wherein an atmospheric pressure dew point of the cushion gas is 15° C. or lower.

[6]
The method for preparing a package of sputtering target according to any one of [1] to [5], wherein in the step 1, a desiccant is housed in the first packaging bag together with the sputtering target.

[7]
The method for preparing a package of sputtering target according to [6], wherein the desiccant comprises a silica gel.

[8]
The method for preparing a package of sputtering target according to [6] or [7], wherein 1 g or more of the desiccant is housed per 100 cm² of a surface area of the sputtering target.

[9]
The method for preparing a package of sputtering target according to any one of [6] to [8], wherein the desiccant is housed in one or more packing bags having a water vapor permeable surface.

[10]
The method for preparing a package of sputtering target according to [9], wherein a total area of the water vapor permeable surface of the one or more packing bags is 1000 mm² or more per 100 cm² of the surface area of the sputtering target.

[11]
The method for preparing a package of sputtering target according to [9] or [10], wherein the one or more packing bags are dustproof.

[12]
The method for preparing a package of sputtering target according to any one of [1] to [11], wherein the sputtering target comprises an oxide of boron.

[13]
The method for preparing a package of sputtering target according to any one of [1] to [12], wherein before carrying out the step 1, a cleaning process comprising either or both of cleaning the sputtering target with an organic solvent and dry cleaning the sputtering target is performed.

[14]
The method for preparing a package of sputtering target according to [13], comprising ultrasonically cleaning the sputtering target in the organic solvent before carrying out the step 1.

[15]
The method for preparing a package of sputtering target according to or [14], comprising performing one or more dry cleanings selected from a group consisting of plasma treatment, laser treatment, and ashing treatment for the sputtering target.

[16]
A method for transporting a package of sputtering target, comprising packaging the sputtering target by the method for preparing a package of sputtering target according to any one of [1] to [15], and transporting the sputtering target.

[17]
The method for transporting a package of sputtering target according to [16], wherein the transporting involves air transportation.

In the method for preparing a package of sputtering target according to one embodiment of the present invention, the moisture blocking effect on the sputtering target is high. Therefore, even in a sputtering target whose surface is likely to be altered by moisture such as a sputtering target comprising an oxide of boron, the surface alteration can be effectively suppressed, which in turn contributes to suppression of arcing. Therefore, the method for preparing a package of sputtering target according to the present invention contributes to improving the yield of sputtered films. For example, this method for preparing a package can be suitably used when the sputtering target is transported for a long distance by air transportation or the like or when it is stored for a long time.

Figure 1:
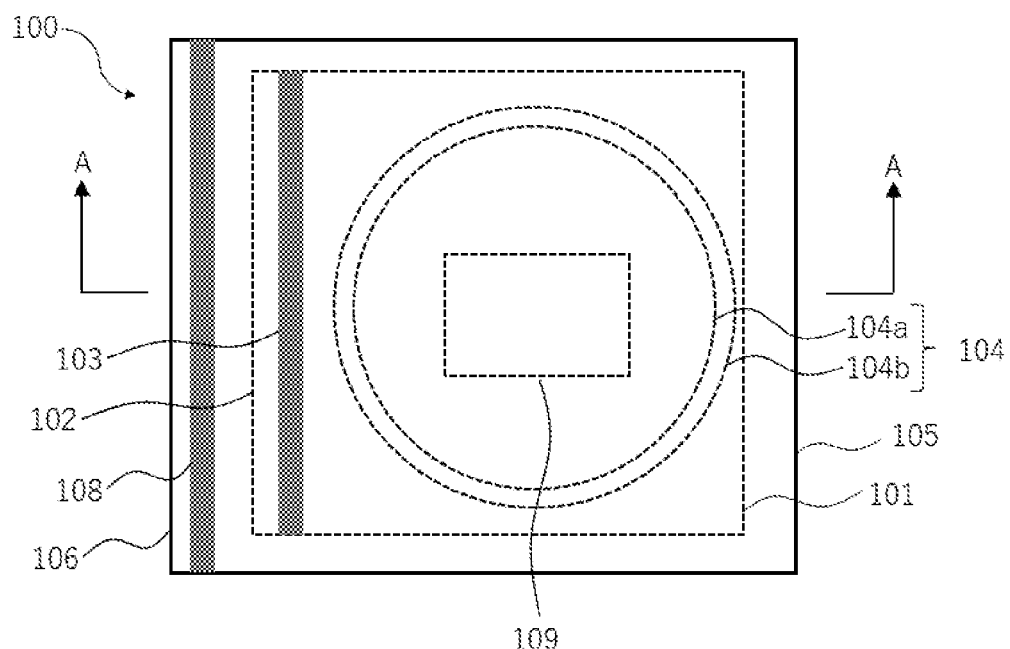
FIG. 1 is a schematic plan view for explaining the internal structure of one example of the package of sputtering target according to the present invention.
Figure 2:
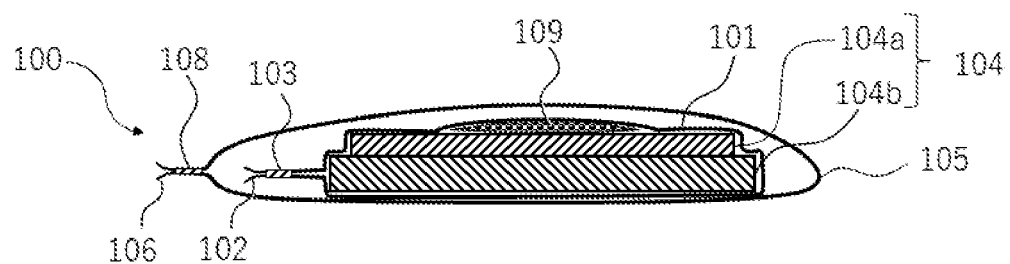
FIG. 2 is a schematic cross-sectional view taken along the line A-A of FIG. 1.

DETAILED DESCRIPTION OF THE INVENTION (1. Package)
FIG. 1 shows a schematic plan view for explaining the internal structure regarding one example of the package of sputtering target according to the present invention. Further, FIG. 2 shows a schematic cross-sectional view taken along the line A-A of FIG. 1. The sputtering target package 100 includes a first packaging bag 101 for housing the sputtering target 104 and a second packaging bag 105 for housing the first packaging bag 101.

The sputtering target 104 includes a disk-shaped backing plate 104b and a disk-shaped sputtering target member 104a bonded to the main surface of the backing plate 104b. In the first packaging bag 101, a desiccant 109 is housed together with the sputtering target 104. An opening 102 of the first packaging bag is sealed by a first sealing portion 103 in a state where the inside of the first packaging bag is kept in vacuum. An opening 106 of the second packaging bag is sealed by a second sealing portion 108 in a state where a cushion gas is enclosed in the second packaging bag.

(2. Method for Preparing a Package of Sputtering Target)
In one embodiment, the method for preparing a package of sputtering target according to the present invention comprises:
  a step 1 of housing the sputtering target in a first packaging bag made of a film having a water vapor permeability of 1 g/(m²·24 h) or less, and then vacuum sealing an opening of the first packaging bag; and
  a step 2 of housing the first packaging bag which has been vacuum sealed in the step 1, in a second packaging bag made of a film having a water vapor permeability of 1 g/(m²·24 h) or less, and then enclosing one or more cushion gases selected from a group consisting of air and inert gas in the second packaging bag, and sealing an opening of the second packaging bag.

(3. Sputtering Target)
There is no particular limitation on the sputtering target that can be packaged by the method for preparing a package of sputtering target according to the present invention. However, by using the method for preparing a package of sputtering target according to the present invention for a sputtering target whose surface is likely to be altered by moisture, the effects of the present invention can be better exerted. Examples of the sputtering target whose surface is likely to be altered by moisture include, for example, a sputtering target comprising an oxide of boron as typified by $B_2O_3$, a sputtering target comprising $P_2O_5$, a sputtering target comprising an oxide of an alkali metal, and a sputtering target comprising an oxide of an alkaline earth metal.

The shape of the sputtering target is not particularly limited. For example, the method for preparing a package of sputtering target according to the present invention can be applied to a rectangular sputtering target, a disk-shaped sputtering target, and a cylindrical sputtering target. The sputtering target may also include, in one embodiment, a substrate such as a backing plate or backing tube, and a sputtering target member bonded to the substrate. A sputtering target including no substrate may be used as well.

(4. Step 1)

In the step 1, the sputtering target is housed in a first packaging bag made of a film having a water vapor permeability of 1 g/(m²·24 h) or less, and then the opening of the first packaging bag is vacuum sealed. In the present invention, the water vapor permeability of the film is determined according to the humidity detection sensor method of JIS K7129: 2008 under the Condition 1 described in Table A. 1 of Annex A. By using a film having a water vapor permeability of 1 g/(m²·24 h) or less for the first packaging bag, it is possible to effectively prevent the penetration of humidity into the first packaging bag. The water vapor permeability of the film used for the first packaging bag may be preferably 0.5 g/(m²·24 h) or less, more preferably 0.2 g/(m²·24 h) or less, even more preferably 0.1 g/(m²·24 h) or less. There is no lower limit to the water vapor permeability of the film used for the first packaging bag, and it may be 0 g/(m²·24 h). Examples of the method of setting the water vapor permeability to 0 g/(m²·24 h) include a method of using a film containing a metal vapor deposition film such as an aluminum vapor deposition film.

The film constituting the first packaging bag may be a single layer film, but from the viewpoint of reducing the water vapor permeability, it is preferably a laminated film in which a plurality of film layers are laminated, and is more preferably a laminated film in which three or more film layers are laminated. When a laminated film is used, the films can be laminated by, for example, but not limited to, using dry lamination and extrusion coat lamination.

Examples of the type of film constituting the first packaging bag include, but not limited to, polyethylene terephthalate (PET) film, polyethylene (PE) film, and nylon film. From the viewpoint of reducing the water vapor permeability, it is preferable that at least these three types of films be laminated in the film constituting the first packaging bag.

As to the polyethylene terephthalate (PET) film, a PET film having aluminum oxide deposited on the outer surface may be suitably used. As to the polyethylene (PE) film, a linear low density polyethylene (LLDPE) film and a low density polyethylene (LDPE) film may be suitably used. As to the nylon film, a biaxially oriented nylon film may be preferably used.

The total film thickness constituting the first packaging bag is preferably 80 μm or more, more preferably 90 μm or more, and even more preferably 100 μm or more, from the viewpoint of reducing the water vapor permeability. There is no upper limit to the total thickness of the film(s) constituting the first packaging bag, but from the viewpoint of maintaining the flexibility of the packaging material, it is preferably 200 μm or less, more preferably 180 μm or less, and even more preferably 150 μm or less. In addition, when using a laminated film, it is preferable that the thickness of each film constituting the first packaging bag be 10 μm or more.

A gas pressure in the first packaging bag which has been vacuum sealed in the step 1 should be preferably low because the amount of water remaining in the first packaging bag decreases. Specifically, a gas pressure at 20° C. in the first packaging bag, which has been vacuum sealed in the step 1, is preferably 250 Pa (abs) or less, more preferably 100 Pa (abs) or less, and even more preferably 50 Pa (abs) or less. There is no lower limit to the gas pressure in the first packaging bag which has been vacuum sealed in the step 1, but the cost becomes high compared with the achievable effect if the vacuum degree is extremely increased. So, the gas pressure is ordinarily 1 Pa (abs) or more, and typically 10 Pa (abs) or more.

The method for vacuum sealing the first packaging bag may be, but not limited to, placing the first packaging bag containing a target member and a desiccant in a chamber of a vacuum packaging machine equipped with a vacuum pump, and sandwiching the opening of the first packaging bag with a heater which is capable of heat welding. At this point, heat welding is not yet performed. After that, the lid of the chamber is closed, and the air in the chamber is degassed to a desired pressure, and then the opening of the first packaging bag is heat-welded. The configuration of the vacuum packaging machine is disclosed in, for example, Japanese Patent Application Publication No. 2016-150759, Japanese Patent Application Publication No. 2015-009823 and Japanese Patent Application Publication No. 2013-203402, the entire contents of which are incorporated by reference into the present specification. The vacuum packaging machine, in one embodiment, may comprise a chamber for accommodating the packaging bag in which a sputtering target is housed, upper and lower block bodies that close from the upper and lower sides to sandwich the periphery of the opening of the packaging bag in the front part of the chamber, heaters provided on the upper and lower block bodies to heat-weld the periphery of the opening of the packaging bag, and an oil rotary vacuum pump for degassing the inside of the chamber to reduce the pressure to negative pressure. The vacuum packaging machine is equipped with a vacuum gauge and has a function of automatically vacuum evacuating the packaging bag until the set vacuum degree is reached.

In the step 1, it is preferable to house a desiccant together with the sputtering target in the first packaging bag. By enclosing the desiccant, the moisture remaining in the first packaging bag or the moisture that will infiltrate into the first packaging bag after packaging can be absorbed. Accordingly, discoloration prevention effect of the sputtering target during storage and transportation can be enhanced.

The type of the desiccant is not limited, but for example, a desiccant comprising one or more types selected from a group consisting of silica gel, zeolite, molecular sieve, calcium chloride, aluminum oxide, calcium oxide, barium oxide and strontium oxide may be suitably used. As the desiccant, silica gel impregnated with cobalt chloride is preferable because the moisture absorption can be judged by the color in appearance.

From the viewpoint of enhancing the discoloration prevention effect of the sputtering target, the desiccant is preferably housed in an amount of 1 g or more, more preferably 2 g or more, and even more preferably 3 g or more per 100 cm² of the surface area of the sputtering target. There is no upper limit to the weight of the desiccant to be housed, but from the viewpoint of suppressing the cost due to excess quality, the desiccant is preferably housed in an amount of 6 g or less, more preferably 5 g or less, and even more preferably 4 g or less per 100 cm² of the surface area of the sputtering target. Note that in the present specification, the surface area of the sputtering target refers to the surface area of the exposed portion of the sputtering target member and the substrate (for example, backing plate, backing tube), and the surface area of the unexposed surface of the sputtering target member (for example, the surface bonded to the substrate) and the unexposed surface of the substrate are excluded from the calculation.

Usually, the desiccant is provided in the form of particles. Therefore, in order to prevent dust, it is preferable to house the desiccant in one or more packing bags having a water vapor permeable surface. Typically, a polyethylene non-woven fabric, a polyester non-woven fabric, or a perforated PET film is used, and the water vapor permeability of the water vapor permeable surface of the packing bag is preferably 10 g/(m²·24 h) or more. The water vapor permeability is determined according to the humidity detection sensor method of JIS K7129: 2008 under the Condition 1 described in Table A. 1 of Annex A.

The total area of the water vapor permeable surface of the one or more packing bags is preferably 200 mm² or more, more preferably 800 mm² or more, and even more preferably 1000 mm² or more per 100 cm² of the surface area of the sputtering target. There is no upper limit to this total area, but from the viewpoint of suppressing costs due to excess quality, it is preferably 10000 mm² or less, more preferably 5000 mm² or less per 100 cm² of the surface area of the sputtering target. The definition of the surface area of the sputtering target here is as described above.

Further, it is preferable that the one or more packing bags, including the water vapor permeable surface, be dustproof from the viewpoint of preventing contamination of the sputtering target. Examples of the material of the dustproof packing bag include a nonwoven fabric made of resin such as polyethylene and polypropylene, and a porous resin film.

(5. Step 2)

In the step 2, the first packaging bag which has been vacuum sealed in the step 1 is housed in a second packaging bag made of a film having a water vapor permeability of 1 g/(m²·24 h) or less, and then one or more cushion gases selected from a group consisting of air and inert gas is enclosed in the second packaging bag, and the opening of the second packaging bag is sealed.

By using a film having a water vapor permeability of 1 g/(m²·24 h) or less for the second packaging bag, it is possible to effectively prevent the penetration of humidity into the second packaging bag. The water vapor permeability of the film used for the second packaging bag may be preferably 0.5 g/(m²·24 h) or less, more preferably 0.2 g/(m²·24 h) or less, even more preferably 0.1 g/(m²·24 h) or less. There is no lower limit to the water vapor permeability of the film used for the second packaging bag, and it may be 0 g/(m²·24 h). Examples of the method of setting the water vapor permeability to 0 g/(m²·24 h) include a method of using a film containing a metal vapor deposition film such as an aluminum vapor deposition film.

The film constituting the second packaging bag may be a single layer film, but from the viewpoint of reducing the water vapor permeability, it is preferably a laminated film in which a plurality of film layers is laminated, and is more preferably a laminated film in which three or more film layers are laminated. When a laminated film is used, the film can be laminated by, for example, but not limited to, using dry lamination and extrusion coat lamination.

Examples of the type of film constituting the second packaging bag include, but not limited to, polyethylene terephthalate (PET) film, polyethylene (PE) film, and nylon film. From the viewpoint of reducing the water vapor permeability, it is preferable that at least these three types of films be laminated in the film constituting the second packaging bag.

As to the polyethylene terephthalate (PET) film, a PET film having aluminum oxide deposited on the outer surface may be suitably used. As to the polyethylene (PE) film, a linear low density polyethylene (LLDPE) film and a low density polyethylene (LDPE) film may be suitably used. As to the nylon film, a biaxially oriented nylon film may be suitably used.

The total film thickness constituting the second packaging bag is preferably 80 μm or more, more preferably 90 μm or more, and even more preferably 100 μm or more, from the viewpoint of reducing the water vapor permeability. There is no upper limit to the total thickness of the film(s) constituting the second packaging bag, but from the viewpoint of maintaining the flexibility of the packaging material, it is preferably 200 μm or less, more preferably 180 μm or less, and even more preferably 150 μm or less. In addition, when using a laminated film, it is preferable that the thickness of each film constituting the second packaging bag be 10 μm or more.

After housing the first packaging bag which has been vacuum sealed in the step 1 in the second packaging bag, it is important to enclose one or more cushion gases selected from the group consisting of air and inert gas in the second packaging bag. Since the cushion gas intervenes between the first packaging bag and the second packaging bag, it plays a role of trapping in the cushion gas the moisture which permeates the second packaging bag during storage and transportation and reaches between the second packaging bag and the first packaging bag. Therefore, it is possible to prevent the humidity from permeating to the packaged sputtering target.

Specifically, the gas pressure at 20° C. in the second packaging bag after the cushion gas is enclosed and the opening of the second packaging bag is sealed is preferably 10 kPa (abs) or more, more preferably 500 kPa (abs) or more, and even more preferably 1000 kPa (abs) or more. There is no upper limit to the gas pressure inside the second packaging bag after the cushion gas is enclosed, but since it may burst if the gas pressure becomes extremely high, the gas pressure is preferably 1150 kPa (abs) or less, and more preferably 1100 kPa (abs) or less. Also, the gas pressure can be set to 120 kPa (abs) or less.

As to the type of the cushion gas enclosed in the second packaging bag, a gas having low reactivity is preferable. Therefore, it is preferable to use one or two or more gas selected from a group consisting of air and inert gas as the cushion gas. Examples of the inert gas include a rare gas such as argon gas and helium, and nitrogen gas.

It is desirable that the cushion gas enclosed in the second packaging bag be dry. Therefore, the atmospheric pressure dew point of the cushion gas is preferably 15° C. or lower, more preferably 10° C. or lower, and even more preferably 0° C. or lower. Although there is no lower limit to the atmospheric pressure dew point of the cushion gas, it is preferable that the atmospheric pressure dew point of the cushion gas be −76° C. or higher, and more preferably −70° C. or higher because obtaining or producing a gas having an extremely low atmospheric pressure dew point is very costly.

Further, the amount of water in the cushion gas is preferably 11.5 g or less per 1 kg of the cushion gas, more preferably 10 g or less per 1 kg of the cushion gas, and even more preferably 8 g or less per 1 kg of the cushion gas. Although there is no lower limit to the amount of water in the cushion gas, it is preferable that the amount of water in the cushion gas be 0.01 g or more per 1 kg of the cushion gas, more preferably 0.02 g or more per 1 kg of the cushion gas because obtaining or producing a gas having an extremely low amount of water is very costly.

If the volume of the cushion gas enclosed in the second packaging bag is too small, the trapping effect due to the cushion gas is weakened. Therefore, it is preferable that the volume be 0.00005 $Nm^3$ or more, more preferably 0.0001 $Nm^3$ or more, and even more preferably 0.0005 $Nm^3$ or more per 100 $cm^2$ of the surface area of the sputtering target. On the other hand, if the volume of the cushion gas enclosed in the second packaging bag is too large, the volume of the second packaging bag becomes excessively large, which increases the transportation cost. Therefore, it is preferable that the volume be 0.003 $Nm^3$ or less, more preferably 0.002 $Nm^3$ or less, and even more preferably 0.001 $Nm^3$ or less per 100 $cm^2$ of the surface area of the sputtering target.

The method of enclosing the cushion gas in the second packaging bag is not limited, but there is a method of using the vacuum packaging machine described above. Normally, a vacuum packaging machine has a function of enclosing a gas, and therefore this function may be used. Alternatively, a method may be used in which the tip of a hose connected to a tank storing a cushion gas is inserted into the second packaging bag through its opening and the cushion gas is supplied. On this occasion, the pressure inside the second packing bag can be determined by attaching a pressure gauge to the hose. Therefore, the gas pressure in the second packaging bag can be adjusted by enclosing the cushion gas until the gas pressure in the second packaging bag reaches a predetermined value. The method for sealing the opening of the second packaging bag is not limited, but a method may be used in which the opening of the second packaging bag is heat sealed after the cushion gas has been enclosed.

Further, a desiccant may be housed in the second packaging bag. By enclosing the desiccant, the moisture remaining in the second packaging bag or the moisture that will infiltrate into the second packaging bag after packaging can be absorbed. Accordingly, discoloration prevention effect of the sputtering target during storage and transportation can be enhanced. The details of the desiccant are the same as those described in the step 1 and thus omitted.

(6. Cleaning)

Before performing the step 1, it is preferable to clean the sputtering target in order to remove the water adsorbed on the target surface. The method of cleaning treatment includes, but is not limited to, a method of performing a cleaning process comprising either or both of cleaning with an organic solvent and dry cleaning. When cleaning with the organic solvent, it is preferable to ultrasonically clean the sputtering target in the organic solvent in order to enhance the cleaning effect. The method of dry cleaning includes, but is not limited to, one or more selected from the group consisting of plasma treatment, laser treatment, and ashing treatment for the sputtering target.

(7. Transportation)

The present invention, in one embodiment, provides a method of transporting a package of sputtering target according to the present invention to a desired location. Dew condensation is likely to occur during the transportation of the package of sputtering target due to a temperature difference or a pressure difference. For example, when the sputtering target is transported for a long distance by air transportation or the like, dew condensation is likely to occur because the temperature and the atmospheric pressure greatly change between the ground and the sky. However, the package of sputtering target according to the present invention has a high moisture blocking effect on the sputtering target. Therefore, surface alteration of the sputtering target can be effectively suppressed, even in the case where a sputtering target whose surface is likely to be altered by moisture such as a sputtering target comprising an oxide of boron is transported.

EXAMPLES

Hereinafter, examples for better understanding of the present invention and its advantages will be shown, but the present invention shall not be limited to these examples.

1. Film

Four types of packaging bags A to D were prepared. The water vapor permeability of the film constituting each packaging bag was measured by using a water vopor permeability meter (available from Lyssy, model L80-5000) under the condition that the permeation area of the test piece was 50 $cm^2$ and in accordance with the humidity detection sensor method of JIS K7129: 2008 (Condition 1 in Table A. 1 of Annex A).

(Packaging Bag A)
  Film thickness: thickness 80 μm
  Water vapor permeability: 6.26 g/($m^2$·24 h)
  Laminated structure: A laminated film in which a PET film (thickness of 10 μm or more) on which aluminum oxide is deposited and a polyethylene film (PE) (thickness of 10 μm or more) are laminated in this order from the outside to the inside by a laminating process.

(Packaging Bag B)
  Film thickness: thickness 105 μm
  Water vapor permeability: 0.11 g/($m^2$·24 h)
  Laminated structure: A laminated film in which a PET film (thickness of 10 μm or more) on which aluminum oxide is deposited, a nylon film (thickness of 10 μm or more), a polyethylene (PE) film (thickness of 10 μm or more), a polyethylene (PE) film (thickness of 10 μm or more) and a linear low-density polyethylene (LLDPE) film (thickness of 10 μm or more) are laminated in this order from the outside to the inside by a laminating process.

(Packaging Bag C)
  Film thickness: thickness 105 μm
  Water vapor permeability: 0.08 g/($m^2$·24 h)
  Laminated structure: A laminated film in which a biaxially oriented nylon film (thickness of 10 μm or more), a PET film (thickness of 10 μm or more) on which aluminum oxide is deposited, and a low density polyethylene (LDPE) film (thickness of 10 μm or more) are laminated in this order from the outside to the inside by a laminating process.

(Packaging Bag D)
  Film thickness: thickness 100 μm
  Water vapor permeability: 0 g/($m^2$·24 h)
  Laminated structure: A laminated film in which a nylon film (thickness of 10 μm or more), a metal aluminum vapor deposition film (thickness of 10 μm or more), a low density polyethylene (LDPE) film (thickness of 10 μm or more) are laminated in this order from the outside to the inside by a laminating process.

2. Sputtering Target

A disk-shaped sputtering target (without a backing plate) for forming a magnetic thin film was prepared. The sputtering target contained Pt: 46.5% by mass, $B_2O_3$: 4.3% by mass, $TiO_2$: 1.5% by mass, $SiO_2$: 1.5% by mass, CoO: 5% by mass, the balance being Co and had a diameter of 165.1 mm, a thickness of 4 mm was prepared. The sputtering target was surface-polished and then cleaned by ultrasonic cleaning using a Vertrel available from DuPont.

3. Desiccant

As the desiccant, silica gel housed in a dustproof polyethylene non-woven fabric packaging bag having a surface that is water vapor permeable (water vapor permeability: 10 g/(m²·24 h) or more) was prepared.

4. Packaging of Sputtering Target

Comparative Examples 1 to 4, Examples 1 to 14

Each of the sputtering targets prepared above was housed in the "Inner Packaging Bag" shown in Table 1 according to the test numbers. Next, in the test numbers in which "Silica gel" were indicated as "Yes" in Table 1, one bag of desiccant was placed on the disk-shaped sputtering target. At this time, the weight of the silica gel in the desiccant was 3 g per 100 cm² of the surface area of the sputtering target. Further, the total area of the water vapor permeable surface of the desiccant packaging bag was 800 mm² per 100 cm² of the surface area of the sputtering target. In the test number in which "Silica gel" is indicated as "Yes (small)" in Table 1, the weight was half and the total area of the water vapor permeable surface was ¼ compared with those of the above silica gel. In the test number in which "Silica gel" is indicated as "Yes (large)" in Table 1, the weight was 4 times and the total area of the water vapor permeable surface was 2 times compared with those of the above silica gel.

Then, using a vacuum packaging machine (Model K1200-1200 available from NPC Incorporated), the air in the inner packaging bag was vacuum evacuated to the gas pressure shown in Table 1 according to the test numbers and the opening of the inner packaging bag was heat sealed so that it was vacuum sealed. The gas pressure inside the inner packaging bag was measured at 20° C. with a vacuum gauge built in the vacuum packaging machine.

Comparative Example 1, Examples 1 to 14

Each of the inner packaging bags which have been vacuum sealed by the above procedure was housed in the "Outer Packaging Bag" shown in Table 1 according to the test numbers. Then, using a vacuum packaging machine (Model K1200-1200 available from NPC Incorporated), as shown in Table 1, a cushion gas of 0.00005 Nm³ to 0.003 Nm³ per 100 cm² of the surface of the sputtering target was enclosed in the outer packaging bag according to the test numbers so that the gas pressure became the value shown in Table 1, and the opening of the outer packaging bag was sealed by heat seal. The gas pressure inside the outer packaging bag was measured at 20° C. with a vacuum gauge built in the vacuum packaging machine.

Comparative Examples 2 to 4

Each of the inner packaging bags which have been vacuum sealed by the above procedure were housed in the "Outer Packaging Bag" shown in Table 1 according to the test numbers. Then, using a vacuum packaging machine (Model K1200-1200 available from NPC Incorporated), the air in the outer packaging bag was vacuum evacuated to the gas pressure shown in Table 1 according to the test numbers and the opening of the outer packaging bag was heat sealed so that it was vacuum sealed. The gas pressure inside the outer packaging bag was measured at 20° C. with a vacuum gauge built in the vacuum packaging machine.

5. Temperature and Humidity Test

The package of each sputtering target packaged by the above procedure was put into a reduced pressure thermostatic tank, and the pressure was kept at 0.7 atm and 5° C., and it was left still for 10 hours. Then, it was put into a thermohygrostat tank under the temperature of 40° C. and the humidity of 90%, and it was left still for 16 hours in the thermohygrostat tank. Then, the packaging bag was opened, the sputtering target was taken out, and the appearance of the surface of the sputtering target was visually evaluated. The evaluation was performed based on the following criteria. The results are shown in Table 1.

3: Deposition of boric acid was visually recognizable.
   2: Deposition of boric acid was not visually recognizable, but discoloration was partially observed on the target surface.
   1: Deposition of boric acid was not visually recognizable, and furthermore, discoloration of the target surface was not recognized.

<6. Film Formation Test>

Each of the sputtering target after the above temperature and humidity test was attached to a sputtering apparatus, and a film forming test was performed under the following conditions, and the number of abnormal discharges was measured.

Sputtering apparatus: DC magnetron sputtering apparatus
   Sputtering condition: Sputtering power 1 kW
   Sputtering time: 20 seconds
   Ar gas pressure: 1.7 Pa
   Pre-sputter: 5 kWhr
   Film forming substrate: Silicon substrate having a diameter of 101.3 mm
   Target film thickness: 100 nm
   The results are shown in Table 1.

TABLE 1

| Test Number | Inner Packaging Bag | Gas Pressure in Inner Packaging Bag | Outer Packaging Bag | Air Pressure in Outer Packaging Bag | Cushion Gas (Type) | Cushion Gas (Atmospheric Pressure Dew Point. ° C.) | Silica Gel | Appearance Test | Counted Number of Abnormal Discharges |
|---|---|---|---|---|---|---|---|---|---|
| Comparative Example 1 | A | 50 Pa | A | 101330 Pa | Amosphere | 9.3 | Yes | 3 | 46 |

TABLE 1-continued

| Test Number | Inner Packaging Bag | Gas Pressure in Inner Packaging Bag | Outer Packaging Bag | Air Pressure in Outer Packaging Bag | Cushion Gas (Type) | Cushion Gas (Atmospheric Pressure Dew Point. ° C.) | Silica Gel | Appearance Test | Counted Number of Abnormal Discharges |
|---|---|---|---|---|---|---|---|---|---|
| Comparative Example 2 | A | 50 Pa | A | 50 Pa | — | 9.3 | None | 3 | 38 |
| Comparative Extraple 3 | B | 50 Pa | B | 50 Pa | — | 9.3 | None | 2 | 31 |
| Comparative Example 4 | B | 50 Pa | B | 50 Pa | — | 9.3 | Yes | 2 | 24 |
| Example 1 | B | 50 Pa | B | 101330 Pa | Atmosphere | 9.3 | Yes | 1 | 0 |
| Example 2 | B | 50 Pa | B | 50880 Pa | Almosphere | 9.3 | Yes | 1 | 1 |
| Example 3 | B | 50 Pa | B | 10133 Pa | Atmosphere | 9.3 | Yes | 1 | 0 |
| Example 4 | B | 50 Pa | B | 111460 Pa | Atmosphere | 9.3 | Yes | 1 | 0 |
| Example 5 | B | 50 Pa | B | 1010 Pa | Atmosphere | 9.3 | Yes | 1 | 1 |
| Example 6 | C | 50 Pa | C | 101330 Pa | Atmosphere | 9.3 | Yes | 1 | 0 |
| Example 7 | D | 50 Pa | D | 101230 Pa | Atmosphere | 9.3 | Yes | 1 | 0 |
| Example 8 | B | 50 Pa | B | 101330 Pa | Nitrogen | −70 | Yes | 1 | 0 |
| Example 9 | B | 50 Pa | B | 101330 Pa | Argon | −70 | Yes | 1 | 0 |
| Example 10 | B | 50 Pa | B | 101230 Pa | Atmosphere | 6 | Yes | 1 | 0 |
| Example 11 | B | 50 Pa | B | 101330 Pa | Atmosphere | 9.3 | Yes (Small) | 1 | 0 |
| Example 12 | B | 50 Pa | B | 101330 Pa | Atmosphere | 9.3 | Yes (Large) | 1 | 0 |
| Example 13 | B | 50 Pa | B | 101320 Pa | Atmosphere | 14.4 | Yes | 1 | 0 |
| Example 14 | B | 50 Pa | B | 101330 Pa | Nitrogen | −76 | None | 1 | 0 |

6. Discussion

In Comparative Examples 1 and 2, since packaging bags having a high water vapor permeability were used as the inner packaging bag and the outer packaging bag, even if the gas pressure in the double packaging bag was adjusted, the sputtering surface was altered by moisture, and there were many abnormal discharges at the time of sputtering.

In Comparative Examples 3 and 4, packaging bags having a low water vapor permeability were used as the inner packaging bag and the outer packaging bag. However, since the gas pressure in the outer packaging bag was not appropriate, the sputtering surface was altered by moisture, and there were many abnormal discharges at the time of sputtering.

On the other hand, in Examples 1 to 14, double packaging was performed using films having a water vapor permeability of 1 g/(m²·24 h) or less, and the inner film was vacuum sealed, and a cushion gas with a predetermined gas pressure was enclosed between the inner film and the outer film. As a result, the alteration of the sputtering target due to moisture was suppressed, and abnormal discharges at the time of sputtering were also significantly suppressed.

DESCRIPTION OF REFERENCE NUMERALS

100 Package
101 First packaging bag
102 Opening of first packaging bag
103 First sealing portion
104 Sputtering target
104a Sputtering target member
104b Backing plate
105 Second packaging bag
106 Opening of second packaging bag
108 Second sealing portion
109 Desiccant

The invention claimed is:

1. A method for preparing a package of sputtering target, comprising:
a step 1 of housing a sputtering target comprising an oxide of boron in a first packaging bag made of a film having a water vapor permeability of 1 g/(m²·24 h) or less, provided that nothing or only a desiccant is housed in the first packaging bag together with the sputtering target, and then vacuum sealing an opening of the first packaging bag,
wherein the sputtering target includes a disk-shaped backing plate and a sputtering target member bonded to a main surface of the backing plate; or
wherein the sputtering target includes a sputtering target member without a further backing substrate such that when the sputtering target is housed within the first packaging bag, top and bottom surfaces of the sputtering target member are exposed within the first packaging bag; and
a step 2 of housing the first packaging bag which has been vacuum sealed in the step 1, in a second packaging bag made of a film having a water vapor permeability of 1 g/(m²·24 h) or less, and then enclosing one or more cushion gases selected from a group consisting of air and inert gas in the second packaging bag, and sealing an opening of the second packaging bag.

2. The method for preparing a package of sputtering target according to claim 1, wherein a gas pressure at 20° C. in the vacuum sealed first packaging bag is 250 Pa (abs) or less.

3. The method for preparing a package of sputtering target according to claim 1, wherein a gas pressure at 20° C. in the second packaging bag after the cushion gas is enclosed is 10 kPa (abs) or more and 1150 KPa (abs) or less.

4. The method for preparing a package of sputtering target according to claim 1, wherein a gas pressure at 20° C. in the second packaging bag after the cushion gas is enclosed is 10 kPa (abs) or more and 120 KPa (abs) or less.

5. The method for preparing a package of sputtering target according to claim 1, wherein an atmospheric pressure dew point of the cushion gas is −76° C. or higher and 15° C. or lower.

6. The method for preparing a package of sputtering target according to claim 1, wherein in the step 1, the desiccant is housed in the first packaging bag together with the sputtering target.

7. The method for preparing a package of sputtering target according to claim 6, wherein the desiccant comprises a silica gel.

8. The method for preparing a package of sputtering target according to claim 6, wherein 1 g or more and 6 g or less of the desiccant is housed per 100 cm² of a surface area of the sputtering target.

9. The method for preparing a package of sputtering target according to claim 6, wherein the desiccant is housed in one or more packing bags having a water vapor permeable surface.

10. The method for preparing a package of sputtering target according to claim 9, wherein a total area of the water vapor permeable surface of the one or more packing bags is 1000 mm² or more per 100 cm² of the surface area of the sputtering target.

11. The method for preparing a package of sputtering target according to claim 9, wherein the one or more packing bags are dustproof.

12. The method for preparing a package of sputtering target according to claim 1, wherein before carrying out the step 1, a cleaning process comprising either or both of cleaning the sputtering target with an organic solvent and dry cleaning the sputtering target is performed.

13. The method for preparing a package of sputtering target according to claim 12, comprising ultrasonically cleaning the sputtering target in the organic solvent before carrying out the step 1.

14. The method for preparing a package of sputtering target according to claim 12, comprising performing one or more dry cleanings selected from a group consisting of plasma treatment, laser treatment, and ashing treatment for the sputtering target.

15. The method for preparing a package of sputtering target according to claim 1, wherein the first packaging bag is not secured to the second packaging bag.

16. The method for preparing a package of sputtering target according to claim 1, wherein the first packaging bag is made of the film having the water vapor permeability of $0.5 \text{ g}/(\text{m}^2 \cdot 24 \text{ h})$ or less.

17. A method for transporting a package of sputtering target, comprising packaging the sputtering target by the method for preparing a package of sputtering target according to claim 1, and transporting the sputtering target.

18. The method for transporting a package of sputtering target according to claim 17, wherein the transporting involves air transportation.

* * * * *